(12) United States Patent
Gokmen

(10) Patent No.: US 10,901,939 B2
(45) Date of Patent: Jan. 26, 2021

(54) COMPUTER ARCHITECTURE WITH RESISTIVE PROCESSING UNITS

(71) Applicant: INTERNATIONAL BUSINESS MACHINES CORPORATION, Armonk, NY (US)

(72) Inventor: Tayfun Gokmen, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 14/928,970

(22) Filed: Oct. 30, 2015

(65) Prior Publication Data

US 2017/0124025 A1    May 4, 2017

(51) Int. Cl.
| | |
|---|---|
| *G06F 15/80* | (2006.01) |
| *G06F 15/78* | (2006.01) |
| *G06F 9/38* | (2018.01) |
| *G11C 13/00* | (2006.01) |
| *G06N 3/04* | (2006.01) |

(52) U.S. Cl.
CPC ........ *G06F 15/8007* (2013.01); *G06F 9/3887* (2013.01); *G06F 15/7867* (2013.01); *G06F 15/80* (2013.01); *G06F 9/3893* (2013.01); *G06N 3/04* (2013.01); *G11C 13/0002* (2013.01); *G11C 13/0007* (2013.01)

(58) Field of Classification Search
CPC . G11C 13/0007; G11C 13/00; G11C 13/0002; G11C 13/0021; G06N 3/063; G06N 3/08; G06N 3/049; G06N 3/04; G06F 12/0207; G06F 15/8007; G06F 9/3887; G06F 15/00; G06F 15/80; G06F 17/15; G06F 17/16; G06F 17/82; G06F 17/00; G06F 9/30036; G06F 9/3893
See application file for complete search history.

(56) References Cited

U.S. PATENT DOCUMENTS

| | | | |
|---|---|---|---|
| 7,302,513 B2 | 11/2007 | Mouttet | |
| 8,856,055 B2 * | 10/2014 | Brezzo | G06N 3/049 706/33 |

(Continued)

OTHER PUBLICATIONS

Hyejung Choi, Heesoo Jung, Joonmyoung Lee, Jaesik Yoon, Jubong Park, Dong-jun Seong, Wootae Lee, Musarrat Hasan, Gun-Young Jung and Hyunsang Hwang, "An electrically modifiable synapse array of resistive switching memory", Aug. 4, 2009, IOP Publishing, pp. 1-5 (Year: 2009).*

(Continued)

*Primary Examiner* — Aimee Li
*Assistant Examiner* — Courtney P Carmichael-Moody
(74) *Attorney, Agent, or Firm* — Tutunjian & Bitetto, P.C.; Rabin Bhattacharya

(57) ABSTRACT

A processor includes an array of resistive processing units connected between row and column lines with a resistive element. A first single instruction, multiple data processing unit (SIMD) is connected to the row lines. A second SIMD is connected to the column lines. A first instruction issuer is connected to the first SIMD to issue instructions to the first SIMD, and a second instruction issuer is connected to the second SIMD to issue instructions to the second SIMD such that the processor is programmable and configurable for specific operations depending on an issued instruction set.

20 Claims, 5 Drawing Sheets

(56) References Cited

U.S. PATENT DOCUMENTS

| | | | |
|---|---|---|---|
| 8,868,477 B2 | 10/2014 | Esser et al. | |
| 8,924,322 B2 | 12/2014 | Datta et al. | |
| 9,563,433 B1* | 2/2017 | Mitu | G06F 9/3851 |
| 9,785,615 B1* | 10/2017 | Merced Grafals | G06F 17/16 |
| 2002/0010844 A1* | 1/2002 | Noel | G06F 9/5077 |
| | | | 711/153 |
| 2002/0013872 A1* | 1/2002 | Yamada | G06F 9/3881 |
| | | | 710/240 |
| 2010/0271885 A1* | 10/2010 | Scheuerlein | G11O 5/025 |
| | | | 365/189.09 |
| 2011/0119215 A1* | 5/2011 | Elmegreen | G06N 3/063 |
| | | | 706/37 |
| 2012/0084241 A1 | 4/2012 | Friedman et al. | |
| 2012/0221793 A1* | 8/2012 | Tran | G06F 12/0811 |
| | | | 711/122 |
| 2012/0317356 A1 | 12/2012 | Ignatowski | |
| 2013/0212431 A1* | 8/2013 | Ong | G06F 15/167 |
| | | | 714/15 |
| 2014/0092667 A1* | 4/2014 | Ordentlich | G06F 11/1048 |
| | | | 365/148 |
| 2014/0156576 A1 | 6/2014 | Nugent | |
| 2014/0172937 A1* | 6/2014 | Linderman | G06G 7/16 |
| | | | 708/607 |
| 2014/0281243 A1* | 9/2014 | Shalf | G06F 12/0813 |
| | | | 711/122 |
| 2014/0354655 A1* | 12/2014 | Kim | G06T 1/20 |
| | | | 345/501 |
| 2015/0131383 A1* | 5/2015 | Akerib | G11C 15/043 |
| | | | 365/185.18 |
| 2015/0170025 A1 | 6/2015 | Wu et al. | |
| 2015/0302906 A1* | 10/2015 | Taylor, Jr. | G11C 7/16 |
| | | | 365/45 |
| 2016/0049195 A1* | 2/2016 | Yu | G11C 13/0026 |
| | | | 365/63 |
| 2016/0224465 A1* | 8/2016 | Morad | G06F 9/38 |
| 2016/0364643 A1* | 12/2016 | Cruz-Albrecht | G06N 3/08 |
| 2017/0019108 A1* | 1/2017 | Kvatinsky | H03K 19/1776 |
| 2017/0117041 A1* | 4/2017 | Hamdioui | G11C 13/0069 |
| 2017/0178725 A1* | 6/2017 | Yang | G11C 13/0069 |
| 2017/0220526 A1* | 8/2017 | Buchanan | G06F 7/5443 |
| 2018/0067720 A1* | 3/2018 | Bekas | G06F 7/483 |
| 2018/0095930 A1* | 4/2018 | Lu | G11C 7/1006 |
| 2018/0121790 A1* | 5/2018 | Kim | G06N 3/04 |
| 2018/0253639 A1* | 9/2018 | Snelgrove | G06N 3/0454 |
| 2019/0005382 A1* | 1/2019 | Li | G06F 17/16 |

OTHER PUBLICATIONS

Chippa, V.K. et al., "StoRM: A Stochastic Recognition and Mining Processor," Proceedings of the 2014 international symposium on Low power electronics and design, Aug. 2014. (pp. 1-6).

Li, B. et al., "RRAM-based Analog Approximate Computing," IEEE Transactions on Computer-Aided Design of Integrated Circuits and Systems, vol. PP, No. 99, Jun. 2015. (pp. 1-13).

Liu, B. et al., "Digital-Assisted Noise-Eliminating Training for Memristor Crossbar-based Analog Neuromorphic Computing Engine," 2013 50th ACM/EDAC/IEEE Design Automation Conference (DAC), Jun. 2013. (pp. 1-6).

Liu, X., et al., "A Heterogeneous Computing System with Memristor-Based Neuromorphic Accelerators," IEEE High Performance Extreme Computing Conference (HPEC), Sep. 2014. (pp. 1-6).

* cited by examiner

COMPUTER ARCHITECTURE WITH RESISTIVE PROCESSING UNITS

BACKGROUND

Technical Field

The present invention relates to computer architectures, and more particularly to an architecture having a resistive processing unit core for analog computations.

Description of the Related Art

Single instruction, multiple data (SIMD), is a class of parallel computers in Flynn's taxonomy. SIMD describes computers with multiple processing elements that perform a same operation on multiple data points concurrently. SIMD machines exploit data level parallelism, but not concurrency as there are simultaneous (parallel) computations, but only a single process (instruction) at a given moment. SIMD is particularly applicable to common tasks like adjusting the contrast in a digital image or adjusting the volume of digital audio. Most modern computer processing unit (CPU) designs include SIMD instructions to improve the performance of multimedia use.

In parallel computer architectures, a systolic array is a homogeneous network of tightly coupled data processing units (DPUs) called cells or nodes. Each node or DPU independently computes a partial result as a function of the data received from its upstream neighbors, stores the result within itself and passes it downstream. Systolic arrays were developed to compute greatest common divisors of integers and polynomials.

SUMMARY

A processor includes an array of resistive processing units connected between row and column lines with a resistive element. A first single instruction, multiple data processing unit (SIMD) is connected to the row lines. A second SIMD is connected to the column lines. A first instruction issuer is connected to the first SIMD to issue instructions to the first SIMD, and a second instruction issuer is connected to the second SIMD to issue instructions to the second SIMD such that the processor is programmable and configurable for specific operations depending on an issued instruction set.

Another processor includes a first core having a first array of resistive processing units connected between row and column lines with a resistive element; a first array of single instruction, multiple data processing units (SIMDs) connected to the row lines and the column lines; and a first instruction issuer connected to the first array of SIMDs to issue instructions. The processor includes a second core having a second array of resistive processing units connected between row and column lines with a resistive element; a second array of SIMDs connected to the row lines and the column lines; and a second instruction issuer connected to the second array of SIMDs to issue instructions wherein the first core and the second core are programmable and configurable for specific operations depending on an issued instruction set. One or more shared memory devices are shared between the first and second cores.

A processing method includes issuing coded instructions to carry out a processing operation to single instruction, multiple data processing units (SIMDs) connected to row lines and column lines of an array of resistive processing units connected between the row lines and column lines with a resistive element at each crossing; applying a voltage to at least one of the row lines and column lines using the SIMDs; outputting a computational result to SIMDs connected to the other of the row lines and the column lines in the form of currents based on a conductance of the resistive processing units; and storing the computational result in a shared memory.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
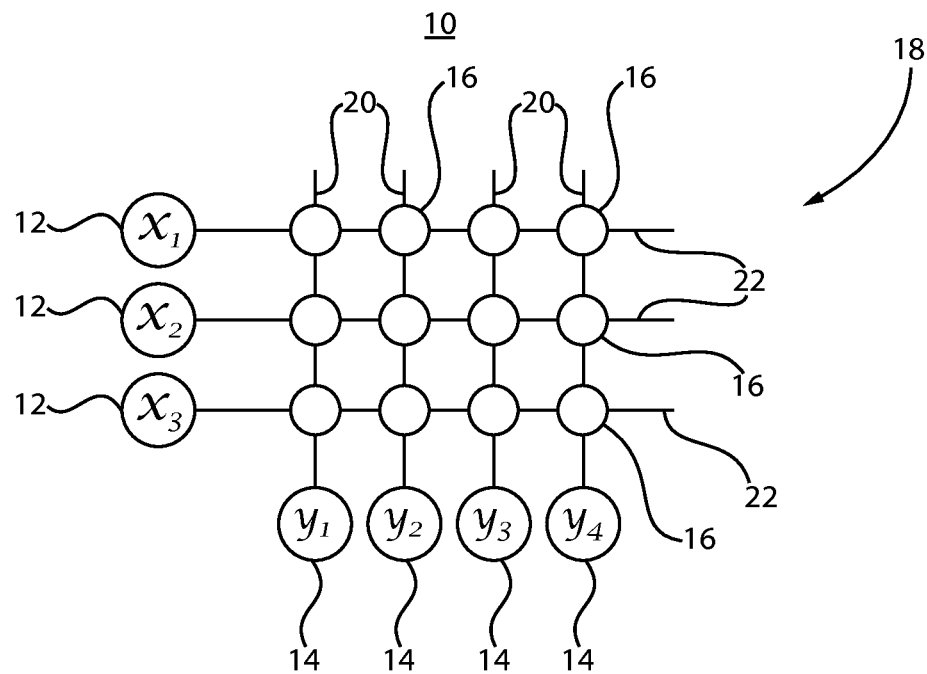
FIG. 1 is a schematic view of a neuromorphic device architecture with cells or nodes for conducting analog computer operations in accordance with the present principles.

In accordance with the present principles, computer architectures are provided where single resistive cross point devices are employed as processing units to accelerate computational operations for applications, such as, e.g., neural network training algorithms and matrix operations. The single resistive cross point devices called resistive processing units (RPUs) can be organized so that the RPUs become programmable. This provides advantages in many areas of computation. For example, instead of designing an application specific integrated circuit (ASIC) for each application, the architecture in accordance with the present principles permits use of a same architecture by simply writing instructions to perform the needed task or algorithm. Different instruction sets can be designed and may be issued in a given order to provide desired computational results.

In useful embodiments, the programmable resistive cross point devices or RPUs may be employed as analog processing elements and accompanied with programmable peripheral circuitry. Using this architecture, fast analog computations can be performed at a core, and peripheral circuitry can be programmed to achieve a desired functionality/algorithm. The architecture may include a two-dimensional (2D) array of resistive processing units. The 2D array can perform very fast analog computations, such as vector-matrix multiplication, update of a matrix stored at the analog RPU devices, etc.

The 2D array may be accompanied by a 1D array of digital processing units that can perform single instructions on multiple data and/or be in charge of translating the digital inputs/outputs to analog input/outputs. Using this architecture, code can be written (instruction sets) to program the periphery digital processors. These digital processors can understand the instructions and perform very fast analog computations on the 2D array of RPUs. The digital processors at the periphery may also be able to move data within the core and between the cores.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that the present invention will be described in terms of a given illustrative architecture; however, other architectures, structures, process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a neuromorphic device 10 is shown in accordance with one implementation of the present principles. The neuromorphic device 10 employs very-large-scale integration (VLSI) systems including electronic analog circuits to mimic neuro-biological architectures present in the nervous system. The neuromorphic device 10 may describe analog, digital, and/or mixed-mode analog/digital VLSI and software systems that implement models of neural systems. The implementation of the neuromorphic device 10 may be realized using an array 18 of cells or nodes 16. The cells or nodes 16 may include, e.g., oxide-based memristors, threshold switches, transistors, RPU devices, etc.

The neuromorphic device 10 includes inputs 12 (e.g., $x_1$, $x_2$, $x_3$, . . . ). Inputs 12 may include a first electrical characteristic, such as a voltage. The neuromorphic device 10 includes a set of outputs 14 (e.g., currents: $y_1$, $y_2$, $y_3$, $y_4$, . . . ).

Figure 2:
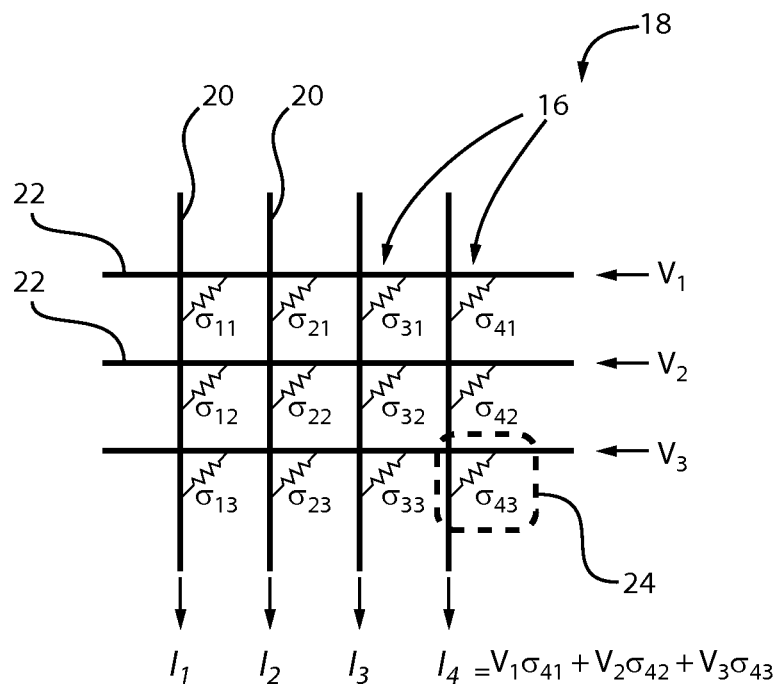
FIG. 2 is a schematic diagram of an array of resistive elements cross connected to row and column conductors and showing a sample output for the neuromorphic device architecture in accordance with the present principles.

Referring to FIG. 2, the array 18 of FIG. 1 is shown in greater detail. The array 18 includes conductors 20 running vertically and conductors 22 running horizontally. The conductors 20 and 22 do not connect directly at intersection points as the conductors 20 and 22 are disposed on different levels. Instead, the conductors 20 and 22 are connected through resistive cross-point devices 24 located at each node 16.

Resistive cross-point devices 24 may be referred to as resistive processing units (RPUs). The RPUs 24 provide a highly parallel and scalable architecture composed of resistive devices for back-propagating neural networks. The RPUs 24 may include, e.g., programmable memristor, resistive random access memory (ReRAM or RRAM), etc.

The RPUs 24 provide a scalable architecture composed of resistive devices that may include phase change, transition metal oxide, conductance change or resistive switching technology to alter input signals and to store data information. The RPUs 24 may be configured to implement an independent component analysis (ICA) Infomax algorithm. ICA Infomax is an optimization for artificial neural networks and other information processing systems. It prescribes that a function that maps a set of input values to a set of output values should be chosen or learned to maximize average Shannon mutual information between the inputs and outputs, subject to a set of specified constraints and/or noise processes. Infomax algorithms perform the optimization process. Independent component analysis (ICA) finds independent signals by maximizing entropy.

In other applications, fast and scalable architectures for matrix operations (e.g., inversion, multiplications, etc.) with RPUs 24 (e.g., RRAM devices) can be achieved. For forward matrix multiplication, voltages ($V_1$, $V_2$, $V_3$, etc.) are supplied on conductors 22 in rows, and currents ($I_1$, $I_2$, $I_3$, $I_4$, etc.) are read from conductors 20 in columns. Conductance values σ are stored as weights. The conductance values in the array 18 include $\sigma_{11}$, $\sigma_{12}$, $\sigma_{13}$, $\sigma_{21}$, $\sigma_{22}$, $\sigma_{23}$, $\sigma_{31}$, $\sigma_{32}$, $\sigma_{33}$, $\sigma_{41}$, $\sigma_{42}$, $\sigma_{43}$, etc. In one example, $I_4 = V_1\sigma_{41} + V_2\sigma_{42} + V_3\sigma_{43}$.

For backward matrix multiplication, the voltages are supplied on the columns (20) and current is read from the rows (22). Weight updates are achieved when voltages are applied on the rows and columns at the same time. The conductance values are updated all in parallel. It should be understood that the function and position of rows and columns are interchangeable, and the columns and rows may be switched.

Figure 3:
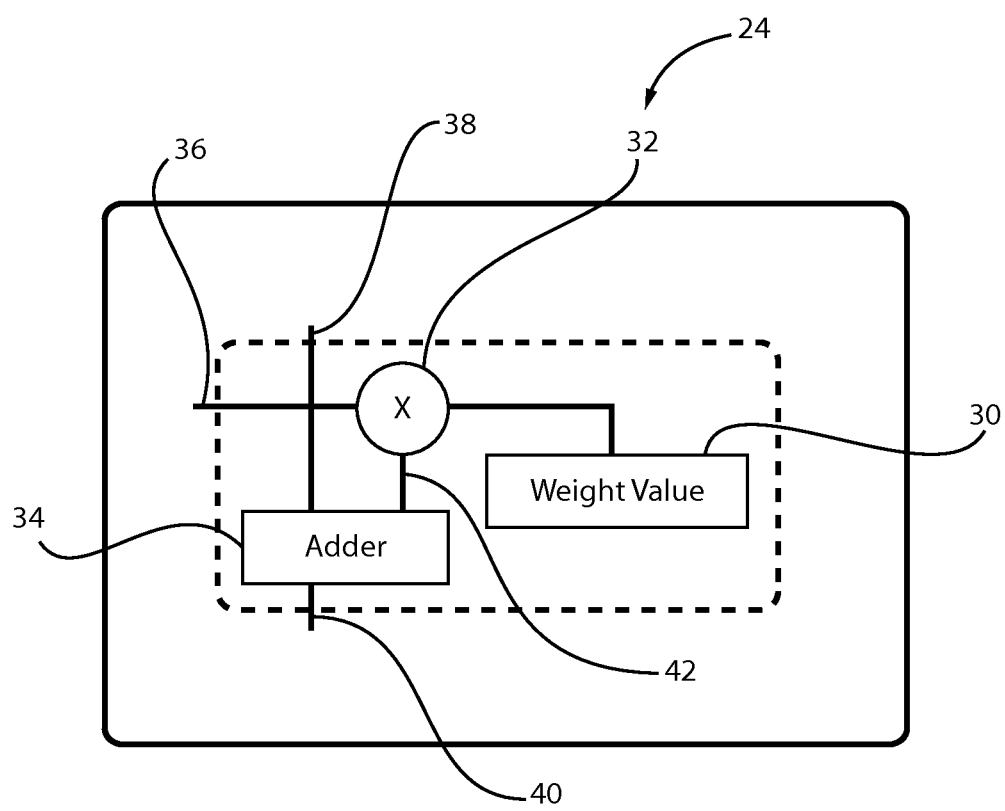
FIG. 3 is a schematic diagram of an illustrative resistive element in accordance with one illustrative embodiment.

Referring to FIG. 3, RPU 24 is shown in greater detail in accordance with one illustrative embodiment. RPU 24 is configured to perform the computation of multiplying a weight value 30 (e.g., a conductance) by a voltage or other input on line 36 using a multiplier 32. A multiplication result 42 and a previous result from line 38 are added by an adder 34 and output on line 40. Depending on the number of RPUs 24 in the array, the results are accumulated. For example, in the example above the operation: $I_4 = V_1\sigma_{41} + V_2\sigma_{42} + V_3\sigma_{43}$ is performed over three RPUs 24.

The RPUs 24 may be programmed by changing the resistance/conductance across a dielectric solid-state material. Different types of cells may be employed for the RPUs 24, e.g., a memristor, resistive random access memory (RRAM), conductive bridging (CBRAM) or phase-change memory (PCM). CBRAM involves one electrode providing ions that dissolve readily in an electrolyte material, while PCM involves generating sufficient Joule heating to affect amorphous-to-crystalline or crystalline-to-amorphous phase changes. RRAM generates defects in a thin oxide layer, known as oxygen vacancies (oxide bond locations where the oxygen has been removed), which can subsequently charge and drift under an electric field. The motion of oxygen ions and vacancies in the oxide would be analogous to the motion of electrons and holes in a semiconductor.

Figure 4:
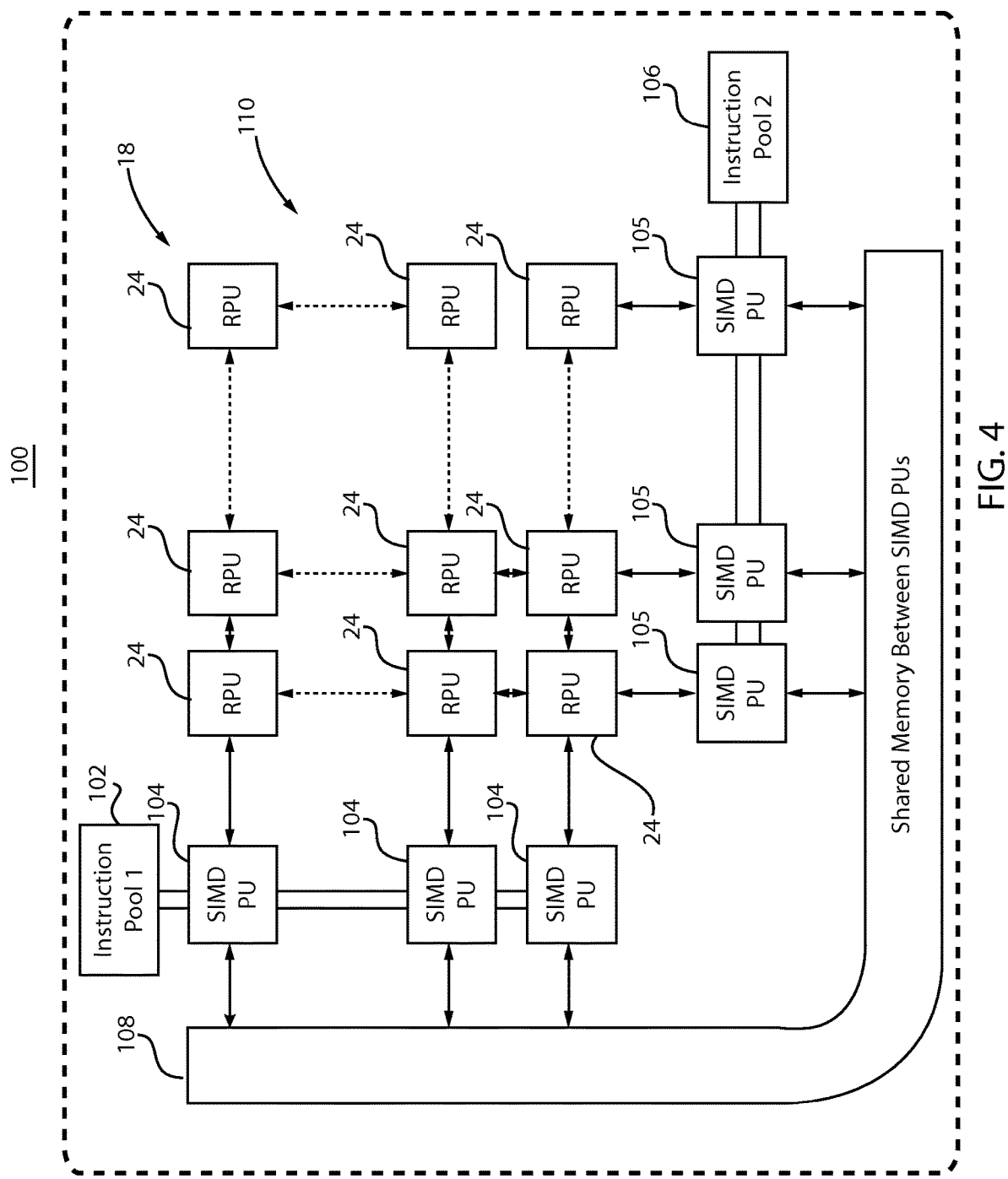
FIG. 4 is a schematic diagram showing a single core architecture for an array of resistive elements and single instruction, multiple data processing units coupled thereto in accordance with the present principles.

Referring to FIG. 4, a single core computing architecture 100 is shown in accordance with one embodiment. The architecture 100 includes an array 18 of RPUs 24 at its core 110. The array 18 can perform very fast analog computations, such as vector-matrix multiplication, update of a matrix stored at the analog RPUs 24, etc. The 2D array 18 is accompanied by a 1D array of digital processing units 104 and 105, such as single instruction multiple data (SIMD) processing units (PUs) that can perform single instruction on multiple data and/or be in charge of translating the digital inputs/outputs to analog input/outputs. The 2D array 18 of analog processing units (RPUs 24) are employed in tandem with programmable 1D array digital processors 104, 105.

Using this architecture 100, periphery digital processors 104, 105 can receive and execute instructions provided by code from instruction pools 102 and 106. Code can be written to program the architecture 100 to perform different applications or functions. For example, the architecture 100 may be programmed to find eigenvalues, perform matrix inversion, perform matrix decomposition or neural network operations, etc.

Figure 5:
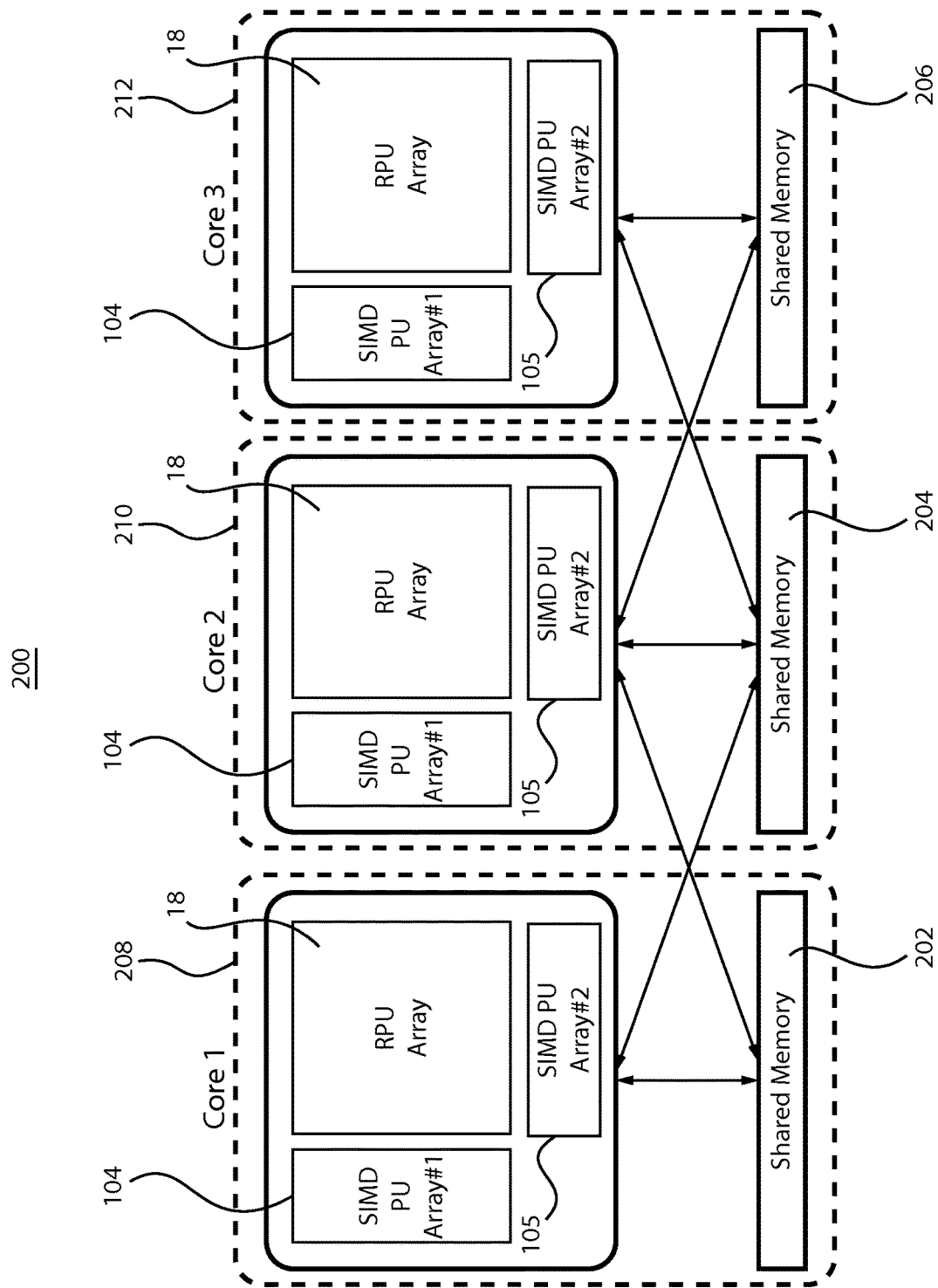
FIG. 5 is a schematic diagram showing a multiple core architecture each having an array of resistive elements and single instruction, multiple data processing units coupled thereto and sharing memory in accordance with the present principles.

The code (instructions) can be configured (written) to solve many problems using parallelism and locality in the architecture 100. The digital processors 104, 105 understand the instructions from instruction issuers or pools 102, 106 and perform analog computations on the 2D array 18 of RPUs 24 very rapidly. The digital processors 104, 105 at the periphery may also be able to move data within the core 100 and between the cores (FIG. 5). The digital processors 104, 105 may employ and share memory 108 at the periphery of the architecture 100.

Referring to FIG. 5, a multi-core architecture 200 shows inter-core communication with shared memory 202, 204, 206. The architecture 200 illustratively shows three cores 208, 210 and 212; however any number of cores may be employed. The cores 208, 210, 212 can address (read/write) shared memory 202, 204, 206 of their own memory and the memory of other cores as well. Although FIG. 5 illustrates the addressing shared memory only for neighboring cores, any cores can address the memory of any other core.

Each core 208, 210, 212 includes RPU array 18 and SIMD PU arrays 104 and 105 at the periphery. As before, the architecture 200 can be configured by writing code for the SIMD arrays 104, 105, which can be delivered as instructions for different operations.

In accordance with the present principles, the architectures 100 and 200 may be configured to perform different operations. The architectures 100 and 200 are particularly useful at computing partial results as a function of the data received from upstream neighbors in the arrays, storing the result within itself and passing the result downstream in a systolic array type manner. Table 1 and Table 2 show illustrative examples of different instruction types that can be issued to the SIMD processing units by e.g., instruction pools 1 and 2. Instruction pools 1 and 2 are indicated in FIG. 4 as instruction pools 102 and 106, respectively. Instruction pools 1 and 2 may be included in FIG. 5 as well.

TABLE 1

| Instruction Pool 1 | Instruction Pool 2 | Operation |
| --- | --- | --- |
| Read from shared memory | | |
| Write to RPU array | Read from RPU array | Forward Matrix Multiplication |
| | Write the results to shared memory for neighboring core | Data movement from core to core |
| | Read results from the shared memory from neighboring core | Data movement from core to core |
| Read from RPU array | Write to RPU array | Backward Matrix Multiplication |
| Apply signals to RPU array for update | Apply error signals to RPU array for update | Weight Update |
| Select single row from RPU array | Read from RPU array | Stored values in RPU array in the selected row are read |

Table 2 includes additional instructions that may be issued. Table 2 is illustrative of other types of operations that may be performed with the present architectures. It should be understood that additional instructions and operations are also contemplated.

TABLE 2

| Instruction Pool 1 | Instruction Pool 2 | Operation |
|---|---|---|
| Write to RPU array | Read from RPU array | Forward Vector - Matrix Multiplication |
| Read from RPU array | Write RPU array | Backward Vector - Matrix Multiplication |
| Signal for update | Signal for update | Weight Update |
| Random signal | Random signal | Initialize the weights to some random values |
| Signal first row | Read from RPU Write values to memory | First row of weights are read First row of weights are now available to outside |
| Signal x row | Signal y column | Weight at (x, y) is modified |
| Reset the RPU values | Reset the RPU values | Reset the weights to some values |

Figure 6:
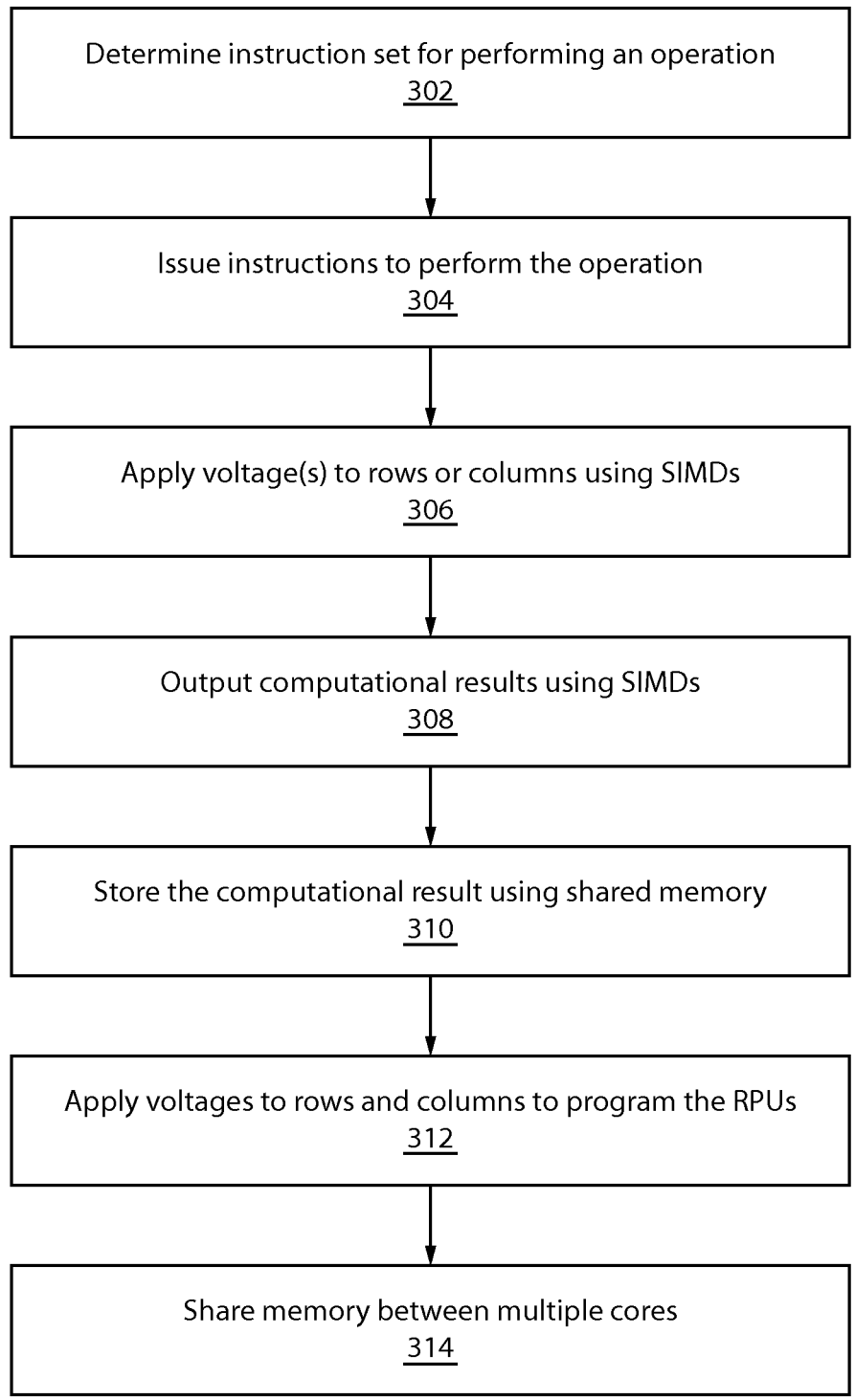
FIG. 6 is a block/flow diagram showing methods for processing using resistive processing units in accordance with illustrative embodiments.

Referring to FIG. 6, a processing method using the architectures in accordance with the present principles is described. In block 302, an instruction set is determined for carrying out an operation. The operation may include a mathematical computation, training a neural network, inverting an matrix or other matrix operations, reading or writing data, etc. In block 304, coded instructions of the instruction set are issued (e.g., by an instruction issuer or pool) to carry out the processing operation. The instructions are received and executed by single instruction, multiple data processing units (SIMDs) connected to row and column lines of an array of resistive processing units (RPUs). The RPUs are connected between the row lines and the column lines with a resistive element at each crossing or cross-point.

In block 306, a voltage is applied to at least one of the row lines and column lines using the SIMDs. The voltages may be the same or different depending on the instruction set. The resistive processing units may include logic operations for computing outputs. The array includes row inputs and column inputs such that when the voltage is applied to the row inputs, the columns output currents, and when the voltage is applied to the column inputs, the row outputs currents. In block 308, a computational result is output to SIMDs connected to the other of the row lines and the column lines in the form of currents based on a conductance of the resistive processing units. In block 310, the computational result is stored in a shared memory.

In block 312, voltages may be applied to the row lines and the column lines to program conductances of the array of resistive processing units. In block 314, memory may be shared between multiple cores, each including an array of SIMDs and an array of resistive processing units coupled to the SIMDs. Other arrangements of cores are also contemplated.

Having described preferred embodiments for computer architecture with resistive processing units (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A processor, comprising:
an array of single resistive cross point processing units connected between row and column lines with a resistive element, wherein the resistive processing units are configured to perform bidirectional communications along the row and column lines using the array of resistive processing units, the resistive processing units being analog processing elements configured for executing analog computations at a core, and being employed in tandem with programmable peripheral circuitry;
at least one first single instruction, multiple data processing unit (SIMD) connected to the row lines; and
at least one second SIMD connected to the column lines;
a first instruction issuer connected to the at least one first SIMD to issue instructions to the at least one first SIMD; and
a second instruction issuer connected to the at least one second SIMD to issue instructions to the at least one second SIMD such that the processor is programmable and configurable for specific operations depending on an issued instruction set.

2. The processor as recited in claim 1, wherein the resistive processing units are cross-coupled between the row lines and the column lines.

3. The processor as recited in claim 1, wherein the resistive processing units include at least one of: programmable memristors or resistive random access memory.

4. The processor as recited in claim 1, wherein the resistive processing units include a weight storage and logic operations for storing and computing outputs.

5. The processor as recited in claim 1, wherein the resistive processing units are programmable by applying voltages using the at least one first SIMD and the at least one second SIMD to modify a conductance representative of a weight value.

6. The processor as recited in claim 1, wherein the at least one first SIMD includes one SIMD per row line and the at least one second SIMD includes one SIMD per column line.

7. The processor as recited in claim 1, further comprising a shared memory at a periphery of the processor that is shared between all SIMDs.

8. The processor as recited in claim 1, wherein the array includes row inputs and column inputs such that when a voltage is applied to the row inputs, the column lines output currents and when a voltage is applied to the column inputs the row lines output currents.

9. A processor, comprising:
a first core including:
a first array of single resistive cross point processing units connected between a first set of row lines and column lines with a resistive element, wherein the resistive processing units are configured to perform bidirectional communications along the row and column lines using the first array of resistive processing units, the resistive processing units being analog processing elements configured for executing analog computations at a core, and being employed in tandem with programmable peripheral circuitry;
a first array of single instruction, multiple data processing units (SIMDs) connected to the first set of row lines and the column lines; and
a first instruction issuer connected to the first array of SIMDs to issue instructions;
a second core including:
a second array of single resistive cross point processing units connected between a second set of row lines and column lines with a resistive element, wherein the resistive processing units are configured to perform bidirectional communications along the row and column lines using the second array of resistive processing units;
a second array of SIMDs connected to the second set of row lines and the column lines; and
a second instruction issuer connected to the second array of SIMDs to issue instructions wherein the first core and the second core are programmable and configurable for specific operations depending on an issued instruction set; and
one or more shared memory devices shared between the first and second cores.

10. The processor as recited in claim 9, wherein the first array of resistive processing units are cross-coupled between the first set of row lines and the column lines and the second array of resistive processing units are cross-coupled between the second set of row lines and the column lines.

11. The processor as recited in claim 9, wherein the first array of resistive processing units and the second array of resistive processing units include at least one of: programmable memristors or resistive random access memory.

12. The processor as recited in claim 9, wherein the first array of resistive processing units and the second array of resistive processing units include a weight storage and logic operations for storing and computing outputs.

13. The processor as recited in claim 9, wherein the first array of resistive processing units and the second array of resistive processing units are programmable by applying voltages using at least one first SIMD and at least one second SIMD to modify a conductance representative of a weight value.

14. The processor as recited in claim 9, wherein the first array of SIMDs and the second array of SIMDs include one SIMD per row line and one SIMD per column line.

15. The processor as recited in claim 9, wherein the first resistive processing units array and the second resistive processing units array include row inputs and column inputs such that when a voltage is applied to the row inputs the column lines output currents and when a voltage is applied to the column inputs the row lines output currents.

16. A processing method, comprising:
issuing coded instructions to carry out a processing operation to single instruction, multiple data processing units (SIMDs) connected to row lines and column lines of an array of single resistive cross point processing units connected between the row lines and column lines with a resistive element at each crossing, wherein the resistive processing units are configured to perform bidirectional communications along the row and column lines using the array of resistive processing units, the resistive processing units being analog processing elements configured for executing analog computations at a core, and being employed in tandem with programmable peripheral circuitry;
applying a voltage to one of the row lines and column lines using the SIMDs;
outputting a computational result to SIMDs connected to the other of the row lines and the column lines in the form of currents based on a conductance of the resistive processing units; and
moving the computational result to a shared memory.

17. The method as recited in claim 16, further comprising applying voltages to the row lines and/or the column lines to program conductances of the array of resistive processing units.

18. The method as recited in claim 16, wherein the array includes row inputs and column inputs such that when the voltage is applied to the row inputs the column lines output currents and when the voltage is applied to the column inputs the row lines output currents.

19. The method as recited in claim 16, wherein the resistive processing units include logic operations for computing outputs.

20. The method as recited in claim 16, further comprising sharing memory between multiple cores, each core including an array of SIMDs and an array of resistive processing units coupled to the array of SIMDs.

* * * * *